(12) United States Patent
Ji et al.

(10) Patent No.: US 10,474,269 B2
(45) Date of Patent: Nov. 12, 2019

(54) DISPLAY PANEL, PRESSURE DETECTION METHOD THEREOF AND DISPLAY DEVICE

(71) Applicant: XIAMEN TIANMA MICRO-ELECTRONICS CO., LTD., Xiamen (CN)

(72) Inventors: Wentao Ji, Xiamen (CN); Jiancai Huang, Xiamen (CN); Zhilong Zhuang, Xiamen (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 47 days.

(21) Appl. No.: 15/942,136

(22) Filed: Mar. 30, 2018

(65) Prior Publication Data

US 2018/0260062 A1 Sep. 13, 2018

(30) Foreign Application Priority Data

Sep. 1, 2017 (CN) .......................... 2017 1 0781006

(51) Int. Cl.
*G06F 3/041* (2006.01)
*G09G 3/20* (2006.01)
(Continued)

(52) U.S. Cl.
CPC ........ *G06F 3/0412* (2013.01); *G02F 1/13338* (2013.01); *G06F 3/0414* (2013.01);
(Continued)

(58) Field of Classification Search
CPC .... G06F 3/0412; G06F 3/0414; G06F 3/0416; G06F 2203/04104; G06F 2203/04105; G06F 1/04; G06F 1/06; G06F 3/0487; G06F 3/04146; G06F 3/04144; G09G 3/006; G09G 3/20; G09G 3/3225; G09G 3/3648; G09G 2310/0297; G09G 2354/00;
(Continued)

(56) References Cited

U.S. PATENT DOCUMENTS 5,764,541 A * 6/1998 Hermann ................. G01G 5/06
 341/167
10,248,254 B1 * 4/2019 Zhang ..................... G06F 3/044
(Continued)

*Primary Examiner* — Julie Anne Watko
(74) *Attorney, Agent, or Firm* — Alston & Bird LLP

(57) ABSTRACT

A display panel, a pressure detection method of the display panel and a display device are disclosed. The display panel includes: a plurality of pressure sensors including first and second sensing signal measurement terminals; a detection module; a first multiplexer and a second multiplexer. Each first signal inputting terminal of the first multiplexer is electrically connected to one of the first sensing signal measurement terminals. Each second signal inputting terminal of the first multiplexer is electrically connected to one of the second sensing signal measurement terminals. First and second signal outputting terminals of the first multiplexer are electrically connected to first and second detection signal terminals, respectively. The first multiplexer controls a connection between one of the first signal inputting terminals and the first detection signal terminal and a connection between one of the second signal inputting terminals and the second detection signal terminal.

13 Claims, 14 Drawing Sheets

(51) Int. Cl.
  *H01L 27/32*   (2006.01)
  *G02F 1/1333*  (2006.01)
  *G09G 3/00*    (2006.01)
  G09G 3/30      (2006.01)
  G09G 3/36      (2006.01)
  G09G 3/3225    (2016.01)

(52) U.S. Cl.
  CPC .......... *G06F 3/0416* (2013.01); *G09G 3/006* (2013.01); *G09G 3/20* (2013.01); *H01L 27/323* (2013.01); *G06F 2203/04104* (2013.01); *G06F 2203/04105* (2013.01); *G09G 3/3225* (2013.01); *G09G 3/3648* (2013.01); *G09G 2310/0297* (2013.01); *G09G 2354/00* (2013.01); *H04M 2250/22* (2013.01)

(58) Field of Classification Search
  CPC .. G09G 3/3275; G09G 3/3685; G09G 3/3688; G09G 3/3692; G09G 2300/0408; G09G 2310/08; H04M 1/03; H04M 2250/22; G02F 1/13338; H01L 27/323
  See application file for complete search history.

(56) References Cited

U.S. PATENT DOCUMENTS

| | | | |
|---|---|---|---|
| 2003/0206162 A1* | 11/2003 | Roberts | G06F 3/0414 345/173 |
| 2012/0098783 A1* | 4/2012 | Badaye | G06F 3/0416 345/174 |
| 2017/0010740 A1* | 1/2017 | Chuang | G06F 3/0416 |
| 2018/0131373 A1* | 5/2018 | Liu | G06F 3/0414 |

\* cited by examiner

DISPLAY PANEL, PRESSURE DETECTION METHOD THEREOF AND DISPLAY DEVICE

CROSS-REFERENCES TO RELATED APPLICATIONS

This application claims priority to Chinese patent application No. CN201710781006.0, filed on Sep. 1, 2017, the disclosure of which is incorporated herein by reference in its entirety.

TECHNICAL FIELD

Embodiments of the present disclosure relate to the field of display technologies, and in particular, to a display panel, a pressure detection method of the display panel and a display device.

BACKGROUND

At present, as an information inputting tool, a display panel with a touch function has been widely used in a variety of electronic devices, such as information inquiring machines in a hall of a public place, computers, mobile phones used by users in daily life and work, and the like. In this way, a user can operate the electronic device just by touching icons on the touch screen with a finger, thereby eliminating other input devices such as a keyboard and a mouse, and making the human-computer interaction simpler. In order to better meet the need of uses. A touch screen is typically provided with a pressure sensor for detecting a touch pressure when a user touches the touch display panel. Not only touch position information can be acquired from the pressure sensor, the touch pressure's magnitude is also acquired, thereby enlarging the application scope of the touch display technologies.

The pressure sensor typically includes two power signal inputting terminals and two sense signal measuring terminals. Each of the pressure sensors in the display panel needs to be tested so as to ensure that the pressure sensor in the display panel is capable of accurately detecting the pressure's magnitude applied to the display panel by a touch body. The specific testing method is as the following. A power signal is applied to the power signal inputting terminal of each pressure sensor in the display panel, and then the touch body touches the display panel. The two sensing signal measurement terminals of each pressure sensor are connected to the corresponding detection terminals of a detection module, respectively, and the pressure sensor in the display panel are tested through sensing signals outputted from the sensing signal measurement terminals.

However, each pressure sensor in the display panel includes two sensing signal measurement terminals. With the above detection method, each pressure sensor needs to respond to two detection terminals of the detection module. With the increase of the number of pressure sensors in the display panel, the number of detection terminals of the detection module corresponding to the pressure sensors will undoubtedly be greatly increased.

SUMMARY

In view of this, the present disclosure provides a display panel, a pressure detection method of the display panel and a display device. The display panel is provided with a first multiplexer. The first multiplexer controls, according to a clock signal inputted to first clock signal terminal, a first sensing signal measurement terminal of one of the pressure sensors to be connected to a first detection signal terminal of a detection module, a second sensing signal measurement terminal of the pressure sensor to be connected to a second detection signal terminal of the detection module, so that the number of detection signal terminals of the detection module is greatly reduced compared with that in the related art. In addition, a second clock signal line electrically connected to a second clock signal terminal of a second multiplexer is configured to be multiplexed as a first clock signal line electrically connected to a first clock signal terminal of the first multiplexer, thereby avoiding further separately providing the first clock signal line electrically connected to the first multiplexer and facilitating the narrow frame of the display panel.

In a first aspect, embodiments of the present disclosure provide a display panel. The display panel includes: a plurality of pressure sensors, each of which includes a first sensing signal measurement terminal and a second sensing signal measurement terminal; a detection module, which includes a first detection signal terminal and a second detection signal terminal; a first multiplexer, which includes a plurality of first clock signal terminals, a plurality of first signal inputting terminals, a plurality of second signal inputting terminals, a first signal outputting terminal and a second signal outputting terminal, each of the plurality of first signal inputting terminals being electrically connected to the first sensing signal measurement terminal of a respective one of the plurality of pressure sensors, each of the plurality of second signal inputting terminals being electrically connected to the second sensing signal measurement terminal of a respective one of the plurality of pressure sensors, the first signal outputting terminal being connected to the first detection signal terminal, and the second signal outputting terminal being connected to the second detection signal terminal; the first multiplexer is configured to control, according to a clock signal inputted to the first clock signal terminals, a connection between one of the first signal inputting terminals and the first detection signal terminal and a connection between one of the second signal inputting terminals and the second detection signal terminal; and a second multiplexer, which includes a plurality of second clock signal terminals and is configured to successively output a data signal to sub pixels which are of different display colors and located within a same pixel unit according to a clock signal inputted to the second clock signal terminals.

In a second aspect, embodiments of the present disclosure further provide a pressure detection method of the display panel in the first aspect. The method includes controlling successively according to a clock signal inputted to the plurality of first clock signal terminals, a connection between the first detection signal terminal and the first signal inputting terminal electrically connected to one of the pressure sensors, and a connection between the second detection signal terminal and the second signal inputting terminal electrically connected to the pressure sensor; and testing a work state of the pressure sensor according to detection signals received by the first detection signal terminal and the second detection signal terminal until work states of all the plurality of pressure sensors are tested.

In a third aspect, embodiments of the present disclosure further provide a display device including the display panel in the first aspect.

Embodiments of the present disclosure provide a display panel, a pressure detection method of the display panel and a display device. The display panel is provided with the first multiplexer. The first sensing signal measurement terminal of each pressure sensor is electrically connected to the first detection signal terminal of the detection module via one of the first signal inputting terminals of the first multiplexer. The second sensing signal measurement terminal of each pressure sensor is electrically connected to the second detection signal terminal of the detection module via one of the second signal inputting terminals of the first multiplexer. The first multiplexer controls, according to a clock signal inputted to the first clock signal terminals, a connection between one of the first signal inputting terminals and the first detection signal terminal and a connection between one of the second signal inputting terminals and the second detection signal terminal. In this configuration, all the pressure sensors of the display panel can be tested by just using two detection signal terminals, and hence the number of detection signal terminals of the detection module is greatly reduced compared with that the related art. Further, the display panel is provided with the second multiplexer for successively outputting a data signal to sub pixels which are of different display colors and located in a same pixel unit, and a second clock signal line electrically connected to the second clock signal terminal of the second multiplexer is configured to be multiplexed as a first clock signal line electrically connected to the first clock signal terminal of the first multiplexer, thereby avoiding further additionally providing the first clock signal line electrically connected to the first multiplexer and facilitating the realization of the narrow frame of the display panel.

BRIEF DESCRIPTION OF DRAWINGS

Other features, objects, and advantages of the disclosure will become more apparent upon reading the detailed description of the non-limiting embodiments in conjunction with the following drawings, in which:

FIG. 12A is a cross sectional view of a schematic structure an OLED display device provided by an embodiment of the present disclosure; and.

DETAILED DESCRIPTION

Figure 1:
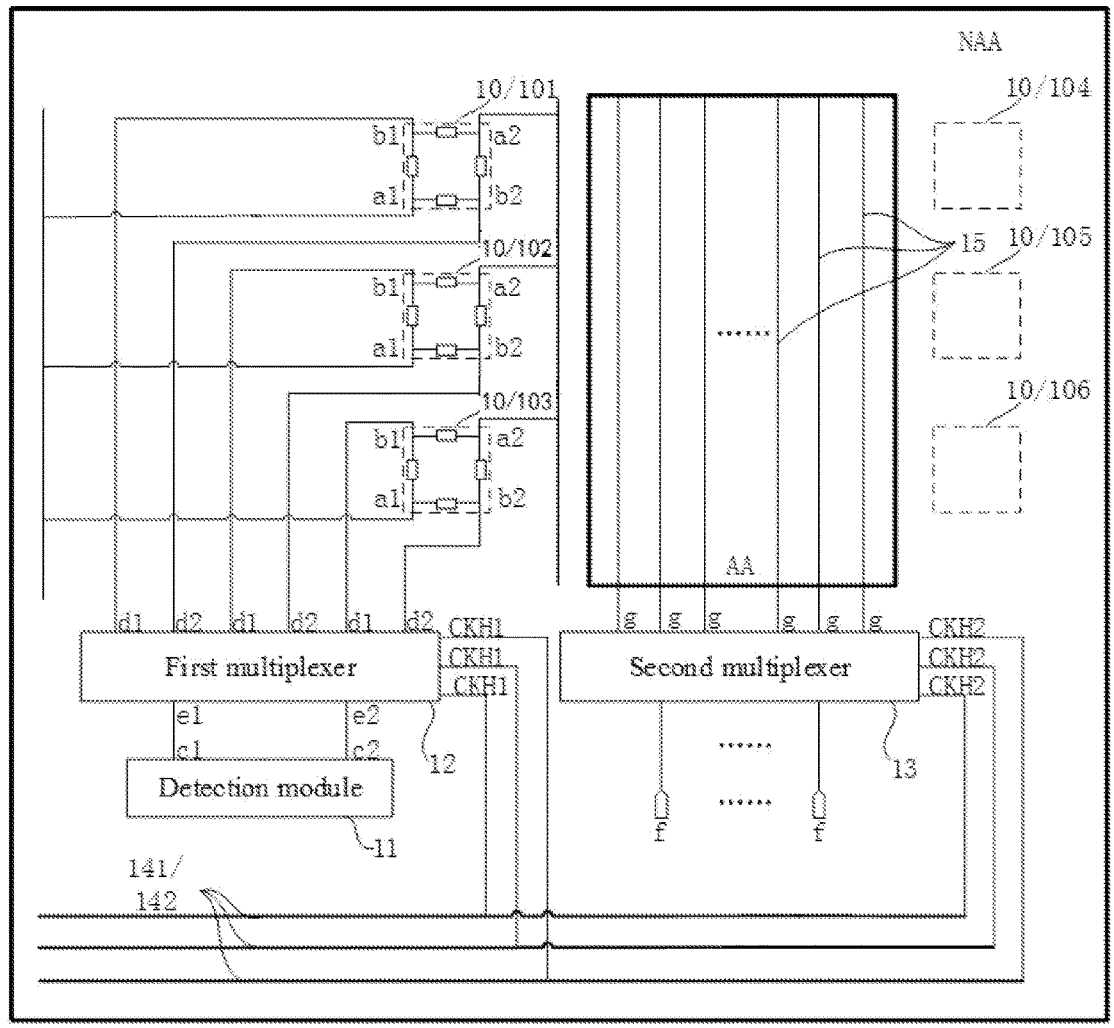
FIG. 1 is a top view of a display panel structure schematics provided by an embodiment of the present disclosure.

The present disclosure will be further described in detail below with reference to the accompanying drawings and embodiments. It should be understood that specific embodiments described herein are only used to explain the present disclosure rather than limit the present disclosure. In addition, it should also be noted that, for the convenience of description, only some but not all structures related to the present disclosure are shown in the accompanying drawings. Throughout the present specification, the same or similar reference numerals denote the same or similar structures, elements or processes. It should be noted that, in the case of no conflict, embodiments in the present application and features in the embodiments may be combined with each other.

Embodiments of the present disclosure provide a display panel. The display panel includes a plurality of pressure sensors, a detection module, a first multiplexer and a second multiplexer. Each pressure sensor includes a first sensing signal measurement terminal and a second sensing signal measurement terminal. The detection module includes a first detection signal terminal and a second detection signal terminal. The first multiplexer includes a plurality of first clock signal terminals, a plurality of first signal inputting terminals, a plurality of second signal inputting terminals, a first signal outputting terminal and a second signal outputting terminal. The second multiplexer includes a plurality of second clock signal terminals. Each first signal inputting terminal is electrically connected to a respective first sensing signal measurement terminal. Each second signal inputting terminal is electrically connected to a respective second sensing signal measurement terminal. The first signal outputting terminal is electrically connected to the first detection signal terminal, and the second signal outputting terminal is electrically connected to the second detection signal terminal. The first multiplexer controls, according to clock signals inputted to the first clock signal terminals, a connection between one of the first signal inputting terminals and the first detection signal terminal and a connection between one of the second signal inputting terminals and the second detection signal terminal. The second multiplexer successively outputs a data signal to sub pixels which are of different display colors and located in a same pixel unit according to a clock signal inputted to the second clock signal terminals. A second clock signal line electrically connected the second clock signal terminal is multiplexed as a first clock signal line electrically connected to the first clock signal terminal.

The pressure sensor typically includes two power signal inputting terminals and two sensing signal measurement terminals. All pressure sensors in the display panel need to be tested so as to ensure that the pressure sensor in the display panel is capable of accurately detecting the magnitude of the pressure applied to the display panel by a touch body. Typically, a power signal is applied to the power signal inputting terminals of each pressure sensor in the display panel, the touch body touches the display panel, the two sensing signal measurement terminals of each pressure sensor are connected to corresponding detection terminals of the detection module, respectively, and the pressure sensors in the display panel are tested through sensing signals outputted from the sensing signal measurement terminals. However, each pressure sensor in the display panel includes two sensing signal measurement terminals. With the above detection method, each pressure sensor needs to correspond to two detection terminals of the detection module. With the increase of the number of pressure sensors in the display panel, the number of detection terminals of the detection module corresponding to the pressure sensors will undoubtedly be greatly increased.

In embodiments of the present disclosure, the first sensing signal measurement terminal of each pressure sensor is electrically connected to the first detection signal terminal of the detection module via one of the first signal inputting terminals of the first multiplexer. The second sensing signal measurement terminal of each pressure sensor is electrically connected to the second detection signal terminal of the detection module via one of the second signal inputting terminals of the first multiplexer. The first multiplexer controls, according to a clock signal inputted to the first clock signal terminals, a connection between one of the first signal inputting terminals and the first detection signal terminal and a connection between one of the second signal inputting terminals and the second detection signal terminal. The pressure sensors of the display panel can be tested by just using two detection signal terminals, and hence the number of detection signal terminals of the detection module is greatly reduced compared with that in the related art. Further, the display panel is provided with the second multiplexer for successively outputting a data signal to sub pixels which are of different display colors and located in a same pixel unit, and a second clock signal line electrically connected to the second clock signal terminal of the second multiplexer is configured to be multiplexed as a first clock signal line electrically connected to the first clock signal terminal of the first multiplexer, thereby avoiding further additionally providing the first clock signal line electrically connected to the first multiplexer and hence facilitating the realization of the narrow frame of the display panel.

The core idea of the present application is mentioned above. The technical solutions in the embodiments of the present disclosure will be described clearly and completely below with the embodiments of the present disclosure with reference to the accompanying drawings. Apparently, the described embodiments are merely some of the embodiments of the present disclosure rather than all of the embodiments. All other embodiments obtained by those of ordinary skill in the art based on the embodiments of the present disclosure without any creative effort shall fall within the protection scope of the present disclosure.

FIG. 1 is a top view of a display panel structure schematics provided by an embodiment of the present disclosure. As shown in FIG. 1, the display panel includes a plurality of pressure sensors 10, a detection module 11, a first multiplexer 12 and a second multiplexer 13. Each pressure sensor 10 includes a first sensing signal measurement terminal b1 and a second sensing signal measurement terminal b2. The detection module includes a first detection signal terminal c1 and a second detection signal terminal c2. The first multiplexer 12 includes a plurality of first clock signal terminals CKH1, a plurality of first signal inputting terminals d1, a plurality of second signal inputting terminals d2, a first signal outputting terminal e1 and a second signal outputting terminal e2. The second multiplexer 13 includes a plurality of second clock signal terminals CKH2.

Each first signal inputting terminal d1 of the first multiplexer 12 is electrically connected to the first sensing signal measurement terminal b1 of one of the pressure sensors 10. Each second signal inputting terminal d2 of the first multiplexer 12 is electrically connected to the second sensing signal measurement terminal b2 of one of the pressure sensors 10. The first signal outputting terminal e1 of the first multiplexer 12 is electrically connected to the first detection signal terminal c1 of the detection module 11, and the second signal outputting terminal e2 of the first multiplexer 12 is electrically connected to the second detection signal terminal c2 of the detection module 11.

The first multiplexer 12 controls, according to clock signals inputted to the first clock signal terminals CKH1, the connection between the first signal inputting terminal d1 and the first detection signal terminal c1, that is, controls the first sensing signal measurement terminal b1 of one of the pressure sensors 10 to be electrically connected to the first detection signal terminal c1 of the detection module 11; and controls, according to clock signals inputted to the first clock signal terminals CKH1, the connection between the second signal inputting terminal d2 and the second signal outputting terminal e2, that is, controls the second sensing signal measurement terminal b2 of one of the pressure sensors 10 to be electrically connected to the second detection signal terminal c2 of the detection module 11. In this way, through the clock signal inputted via a respective first clock signal terminal CKH1 of the first multiplexer 12, the first sensing signal measurement terminal b1 of a respective pressure sensor 10 is controlled to be electrically connected to the first detection signal terminal c1 of the detection module 11, and the second sensing signal measurement terminal b2 is controlled to be electrically connected to the second detection terminal c2 of the detection module 11. At a next clock, through clock signals inputted to remaining first clock signal terminals CKH1, the first sensing signal measurement terminals b1 of remaining pressure sensors 10 are successively controlled to be electrically connected to the first detection signal terminal c1 of the detection module 11, and the second sensing signal measurement terminals b2 are controlled to be electrically connected to the second detection terminal c2 of the detection module 11. All the pressure sensors 10 of the display panel are tested by using just two detection terminals of the detection module 11, thereby greatly reducing the number of detection signal terminals of the detection module 11.

As shown in FIG. 1, the display panel may further include a second multiplexer 13. The second multiplexer 13 includes a plurality of second clock signal terminals CKH2, a plurality of data signal inputting terminals f and a plurality of data signal outputting terminals g. A display region AA of the display panel includes a plurality of pixel units (not shown in FIG. 1). Each pixel unit includes sub pixels controlling different display colors. Each data signal outputting terminal g is electrically connected to a respective sub pixel via a data signal line 15. Exemplarily, each pixel unit is configured to include three sub pixels, and a ratio of the data signal inputting terminals f to the data signal outputting terminals g of the second multiplexer 13 is set to be 1:3. The second multiplexer 13 may successively control, according to clock signals inputted to the second clock signal terminals CKH2, the data signal outputting terminals g to be connected to the data signal inputting terminals f, thereby achieving the configuration that the second multiplexer 13 successively outputs, according to clock signals inputted to the second clock signal terminals CKH2, data signals to sub pixels which are of different display colors and within a same pixel unit. If no second multiplexer 13 is provided, the number of data signal outputting terminals f would be equal to the number of sub pixel units of the display panel. Therefore, the number of data signal outputting terminals f is greatly reduced by providing the second multiplexer 13.

As shown in FIG. 1, a second clock signal line 142 electrically connected to the second clock signal terminal CKH2 is multiplexed as a first clock signal line 141 electrically connected to the first clock signal terminal CKH1. Exemplarily, the second multiplexer 13 is configured to include three second clock signal terminals CKH2, the first multiplexer 12 is configured to include three first clock signal terminal CKH1, the second clock signal line 142 electrically connected to the second clock signal terminal CKH2 is configured to be multiplexed as the first clock signal line 141 electrically connected to the first clock signal terminal CKH1 at the same position. In this way, it is no longer necessary to additionally arrange an individual first clock signal line 141 electrically connected to the first multiplexer 12 in a periphery circuit region NAA of the display panel, thereby facilitating the narrow frame of the display panel.

Optionally, as shown in FIG. 1, the display panel includes a display region AA and a periphery circuit region NAA surrounding the display region AA, the pressure sensors 10 may be arranged in the periphery circuit region NAA of the display panel, and the detection module 11 may also be arranged in the periphery circuit region NAA, so that the pressure sensor 10 or the detection module 11 does not blocks light to affect the display effect of the display panel. Exemplarily, a visible detection module of the display panel may be multiplexed as the detection module. The detection module may also be separately arranged or may be integrated within a driving chip which is located in the periphery circuit region and used to drive the display panel for displaying.

It should be noted that, FIG. 1 exemplarily illustrates an area ratio of the display region AA and the periphery circuit region NAA in order to reflect a circuit structure and connection relationship of the periphery circuit region NAA of the display panel, but not limit the areas of the display region AA and the periphery circuit region NAA of the display panel.

Figure 2:
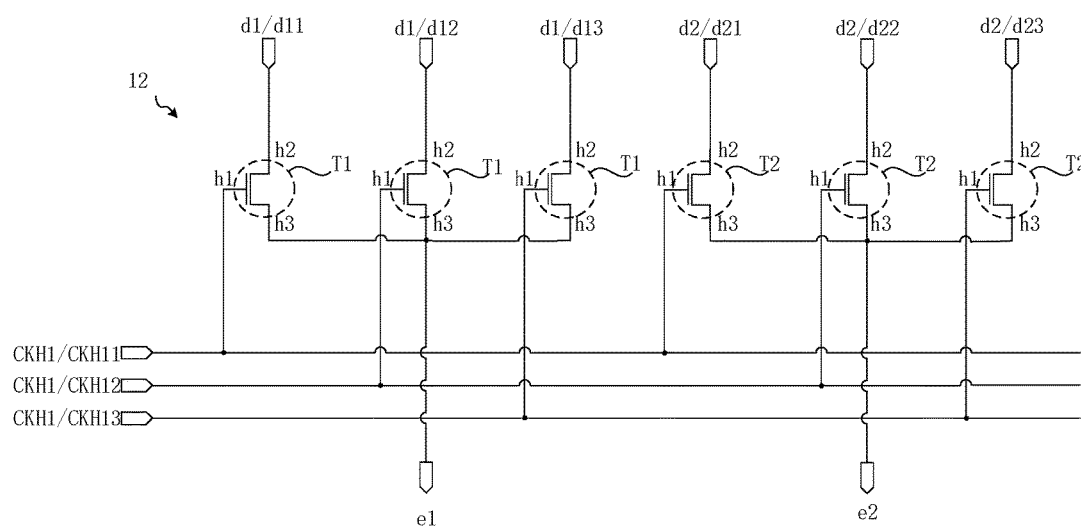
FIG. 2 is a circuit structural schematic diagram of a first multiplexer provided by an embodiment of the present disclosure.

FIG. 2 is a circuit structural schematic diagram of a first multiplexer provided by an embodiment of the present disclosure. As shown in FIG. 2, the first multiplexer 12 further includes a plurality of first thin film transistors T1 and a plurality of second thin film transistors T2. The control terminal h1 of each first thin film transistor T1 is electrically connected to a respective first clock signal terminal CKH1, a first terminal h2 of each first thin film transistor T1 is electrically connected to a respective first signal inputting terminal d1, and a second terminal h3 of each first thin film transistor T1 is electrically connected to the first signal outputting terminal e1. A control terminal h1 of each second thin film transistor T2 is electrically connected to a respective first clock signal terminal CKH1, a first terminal h2 of each second thin film transistor T2 thereof is electrically connected to a respective second signal inputting terminal d2, and a second terminal h3 of each second thin film transistor T2 thereof is electrically connected to the second signal outputting terminal e2.

Exemplarily, with reference to FIGS. 1 and 2, detection may be performed with respect to three pressure sensors 10 of the display panel. In this case, three first sensing signal measurement terminals b1 and three second sensing signal measurement terminals b2 are electrically connected to the first multiplexer 12, and hence the first multiplexer 12 may be configured to include three first signal inputting terminals d1, three second signal inputting terminals d2 and three first clock signal terminals CKH1. It may be configured that the first sensing signal measurement terminal b1 of the pressure sensor 101 is electrically connected to the first signal inputting terminal d11 and the second sensing signal measurement terminal b2 of the pressure sensor 101 is electrically connected to the second signal inputting terminal d21; the first sensing signal measurement terminal b1 of the pressure sensor 102 is electrically connected to the first signal inputting terminal d12 and the second sensing signal measurement terminal b2 of the pressure sensor 102 is electrically connected the second signal inputting terminal d22; the first sensing signal measurement terminal b1 of the pressure sensor 103 is electrically connected to the first signal inputting terminal d13 and the second sensing signal measurement terminal b2 of the pressure sensor 103 is electrically connected the second signal inputting terminal d23.

Specifically, through controlling the clock signal inputted to the first clock signal terminal CKH11, the first signal inputting terminal d11 and the first signal outputting terminal e1 of the first multiplexer 12 are controlled to be electrically connected, and the second signal inputting terminal d21 and the second signal outputting terminal e2 are controlled to be electrically connected, such that the detection module 11 can detect the pressure sensor 101. At a next phase, through controlling the clock signal inputted to the first clock signal terminal CKH12, the first signal inputting terminal d12 and the first signal outputting terminal e1 of the first multiplexer 12 are controlled to be electrically connected, and the second signal inputting terminal d22 and the second signal outputting terminal e2 are controlled to be electrically connected, such that the detection module 11 can detect the pressure sensor 102. The pressure sensor 103 can be detected in the same manner. Thus, three pressure sensors are tested by using two detection terminals of the detection module 11. If no first multiplexer is provided, six detection terminals of the detection module are required to detect these three pressure sensors. Thus, the number of detection terminals of the detection module 11 is reduced compared with that the related art.

Figure 3:
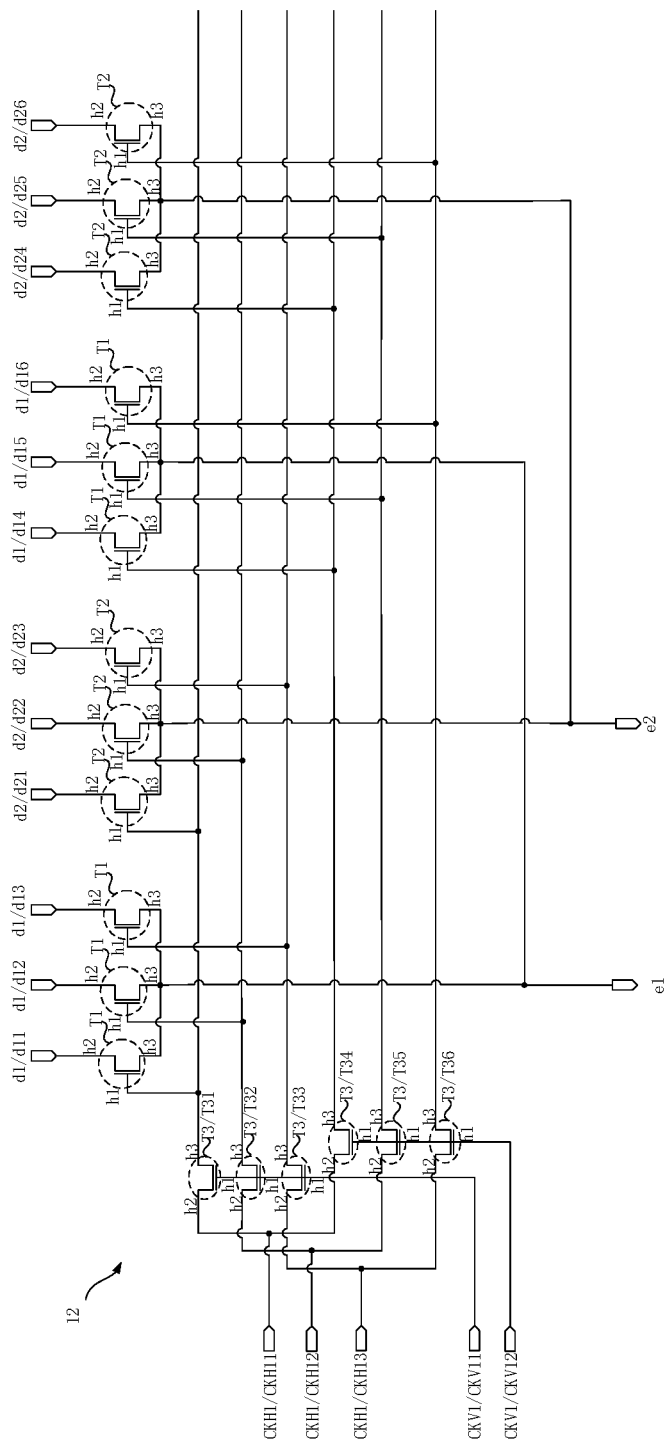
FIG. 3 is a circuit structural schematic diagram of another type of first multiplexer provided by an embodiment of the present disclosure.

FIG. 3 is a circuit structural schematic diagram of another type of first multiplexer provided by an embodiment of the present disclosure. With reference to FIGS. 1 and 3, based on the first multiplexer 12 in FIG. 2, the first multiplexer 12 may further include a plurality of third thin film transistors T3 and a plurality of third clock signal terminals CKV1. A control terminal h1 of each third thin film transistor T3 is electrically connected to a respective third clock signal terminals CKV1, a first terminal h2 of each third thin film transistor T3 thereof is electrically connected to a respective first clock signal terminal CKH1, and a second terminal h3 of each third thin film transistor T3 thereof is electrically connected to the control terminal h1 of a respective first thin film transistor T1 and the control terminal h1 of a respective second thin film transistor T2. The first multiplexer 12 controls, according to the clock signal inputted to the first clock signal terminal CKH1 and the clock signal inputted to the third clock signal terminal CKV1, a respective first signal inputting terminal d1 to be connected to the first detection signal terminal c1, and a respective second signal inputting terminal d2 to be connected to the second detection signal terminal c2.

Exemplarily, with reference to FIG. 1, the right side of the display panel may also be provided with three pressure sensors 10 (merely illustrated by the dotted box in FIG. 1, no pressure sensor structure is actually illustrated) having the same form as those in the left side, the three pressure sensor 10 at the right side are likewise electrically connected to the first multiplexer 12. Then, the detection is performed with respect to the six pressure sensors 10 of the display panel, and six first sensing signal measurement terminals b1 and six second sensing signal measurement terminals b2 are electrically connected to the first multiplexer 12, so that the first multiplexer 12 is configured to include six first signal inputting terminals d1, six second signal inputting terminals d2, three first clock signal terminals CKH1 and two third clock signal terminals CKV1.

Specifically, with reference to FIGS. 1 and 3, the first sensing signal measurement terminal b1 of the pressure sensor 101 is configured to be electrically connected to the first signal inputting terminal d11, the second sensing signal measurement terminal b2 of the pressure sensor 101 is electrically connected to the second signal inputting terminal d21; the first sensing signal measurement terminal b1 of the pressure sensor 102 is configured to be electrically connected to the first signal inputting terminal d12, the second sensing signal measurement terminal b2 of the pressure sensor 102 is electrically connected to the second signal inputting terminal d22; the first sensing signal measurement terminal b1 of the pressure sensor 103 is configured to be electrically connected to the first signal inputting terminal d13, the second sensing signal measurement terminal b2 of the pressure sensor 103 is electrically connected to the second signal inputting terminal d23; the first sensing signal measurement terminal b1 of the pressure sensor 104 is configured to be electrically connected to the first signal inputting terminal d14, the second sensing signal measurement terminal b2 of the pressure sensor 104 is electrically connected to the second signal inputting terminal d24; the first sensing signal measurement terminal b1 of the pressure sensor 105 is configured to be electrically connected to the first signal inputting terminal d15, the second sensing signal measurement terminal b2 of the pressure sensor 105 is electrically connected to the second signal inputting terminal d25; and the first sensing signal measurement terminal b1 of the pressure sensor 106 is configured to be electrically connected to the first signal inputting terminal d16, and the second sensing signal measurement terminal b2 of the pressure sensor 106 is electrically connected to the second signal inputting terminal d26.

With reference to FIGS. 1 and 3, by controlling the clock signal inputted to the first clock signal terminal CKH11 and the clock signal inputted to the third clock signal terminal CKV11, the first signal inputting terminal d11 is controlled to be electrically connected to the first signal outputting terminal e1, and the second signal inputting terminal d21 is controlled to be electrically connected to the second signal outputting terminal e2, such that the detection module 11 can detect the pressure sensor 101. At a next phase, the detection of the pressure sensor 102 by the detection module 11 can be realized by controlling the clock signal inputted to the first clock signal terminal CKH12 and the clock signal inputted to the third clock signal terminal CKV11. At a next phase, the detection of the pressure sensor 103 by the detection module 11 can be realized by controlling the clock signal inputted to the first clock signal terminal CKH13 and the clock signal inputted to the third clock signal terminal CKV11. Likewise, at a next phase, by controlling the clock signal inputted to the first clock signal terminal CKH11 and the clock signal inputted to the third clock signal terminal CKV12, the first signal inputting terminal d14 is controlled to be electrically connected to the first signal outputting terminal e1, and the second signal inputting terminal d24 is controlled to be electrically connected to the second signal outputting terminal e2, such that the detection module 11 can detect the pressure sensor 104. At a next phase, the detection of the pressure sensor 105 by the detection module 11 can be realized by controlling the clock signal inputted to the first clock signal terminal CKH12 and the clock signal inputted to the third clock signal terminal CKV12. At a next phase, the detection of the pressure sensor 106 by the detection module 11 can be realized by controlling the clock signal inputted to the first clock signal terminal CKH13 and the clock signal inputted to the third clock signal terminal CKV12. Compared with the first multiplexer 12 having the structure shown in FIG. 2, the first multiplexer 12 having the structure shown in FIG. 3 can detect six pressure sensors by just using two detection terminals of the detection module 11. If no first multiplexer is provided, twelve detection signal terminals of the detection module are required to realize the detection of six pressure sensors. Thus, the arrangement of the first multiplexer further reduces the number of detection signal terminals of the detection module 11.

In addition, with reference to FIGS. 1 and 3, the three pressure sensors 101, 102, 103 at the left side of the display panel and the three pressure sensors 104, 105 and 106 at the right side of the display panel are electrically connected to the first detection signal terminal c1 of the detection module 11 via the first signal outputting terminal e1 of the first multiplexer 12, and are electrically connected to the second detection signal terminal c2 of the detection module 11 via the second signal outputting terminal e2 of the first multiplexer 12, such that the detection process of each of pressure sensors is achieved.

Optionally, the first multiplexer 12 may include n first clock signal terminal CKH1, 2n first signal inputting terminal d1 and 2n third thin film transistors T3, where n is an integer greater than 1. Exemplarily, as shown in FIG. 3, n may be set to 3, and accordingly, the first multiplexer 12 includes three first clock signal terminals CKH1, six first signal inputting terminals d1 and six second signal inputting terminals d2 and six third thin film transistors T3. The control terminal h1 of each of the first thin film transistors T1 is electrically connected to corresponding first clock signal terminal CKH1 via one of the third thin film transistors T3, and the control terminal h1 of each of the second thin film transistors T2 is electrically connected to corresponding first clock signal terminal CKH1 via one of the third thin film transistors T3. Control terminals h1 of third thin film transistors T3 which are electrically connected to different first clock signal terminals CKH1 are all electrically connected to one of the third clock signal terminals CKV1. For example, the third thin film transistor T31 electrically connected to the first clock signal terminal CKH11, the third thin film transistor T32 electrically connected to the first clock signal terminal CKH12, and the third thin film transistor T33 electrically connected to the first clock signal terminal CKH13 are all electrically connected to the third clock signal terminal CKV11, and the third thin film transistor T34 electrically connected to the first clock signal terminal CKH11, the third thin film transistor T35 electrically connected to the first clock signal terminal CKH12, and the third thin film transistor T36 electrically connected to the first clock signal terminal CKH13 are all electrically connected to the third clock signal terminal CKV12.

It should be noted that FIGS. 2 and 3 merely exemplarily illustrate the configuration of the number of pressure sensors 10 of the display panel. The number of pressure sensors 10 of the display panel is not limited in embodiments of the present disclosure, as long as the number of the pressure sensors 10 is ensured to match the first signal inputting terminal d1, the second signal inputting terminal d2, the first clock signal terminals CKH1 and the third clock signal terminals CKV1 of the first multiplexer 12.

Figure 4A:
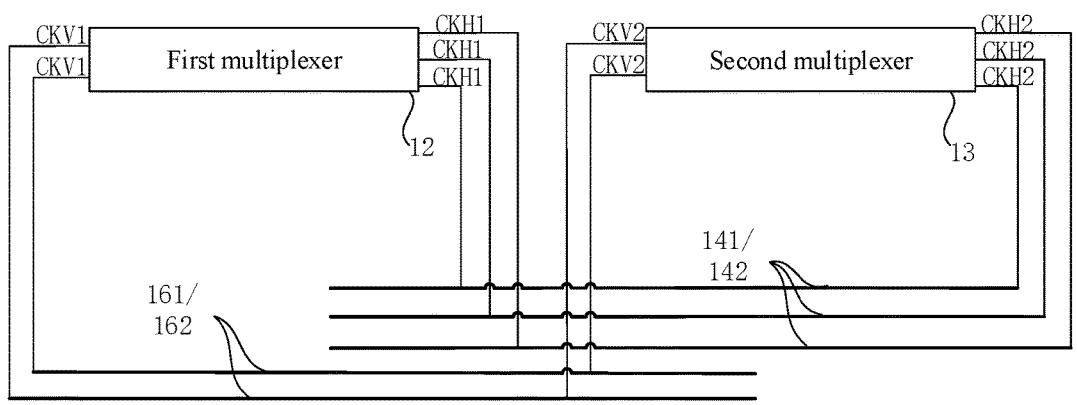
FIG. 4A is a schematic diagram showing a line multiplexing relationship between the first multiplexer and a second multiplexer provided by an embodiment of the present disclosure.
Figure 4B:
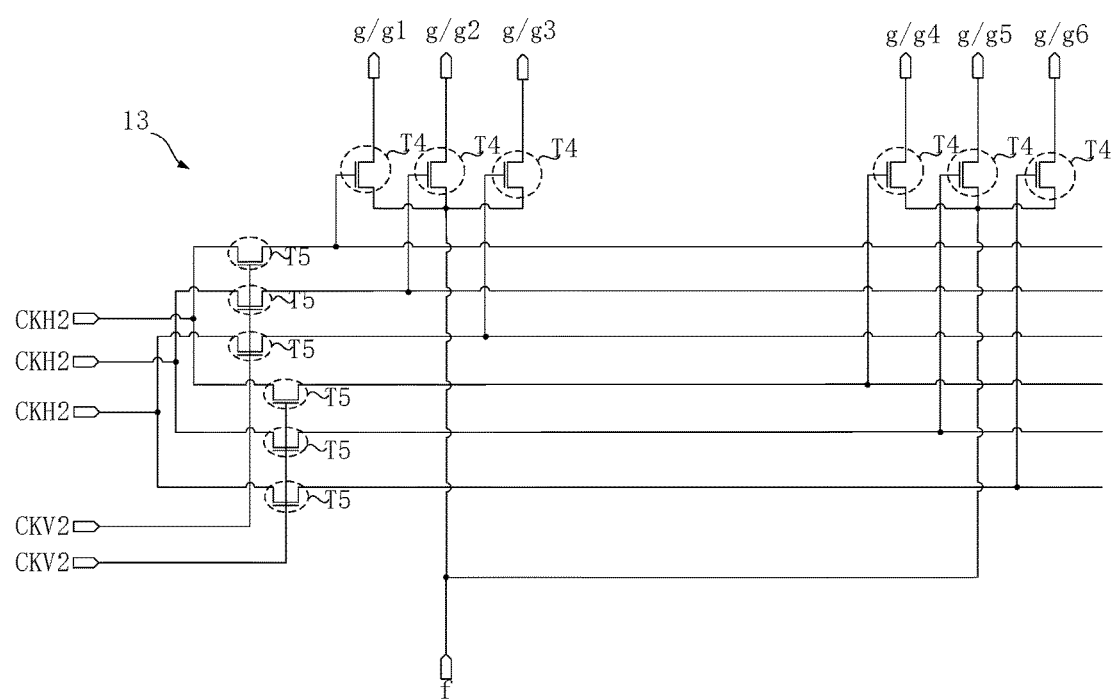
FIG. 4B is a schematic diagram showing a circuit structure of the second multiplexer provided by an embodiment of the present disclosure.

FIG. 4A is a schematic diagram showing a line multiplexing relationship between the first multiplexer and the second multiplexer provided by an embodiment of the present disclosure. FIG. 4B is a schematic diagram showing a circuit structure of a second multiplexer provided by an embodiment of the present disclosure. As shown in FIG. 4B, the second multiplexer 13 includes a plurality of fourth thin film transistors T4, a plurality of fifth thin film transistors T5, a plurality of second clock signal terminals CKH2, a plurality of fourth clock signal terminals CKV2, one data signal inputting terminal f and a plurality of data signal outputting terminals g. Exemplarily, the data signal outputting terminals g1, g2 and g3 are respectively electrically connected to sub pixels (not shown in FIG. 4B) which are of different display colors and located in the same pixel unit, and the data signal outputting terminals g4, g5 and g6 are respectively electrically connected to sub pixels which are of different display colors and located in another pixel unit. The operation principle of the second multiplexer is similar to that of the first multiplexer 12 shown in FIG. 3 and is not repeated herein. The second multiplexer 13 may successively output data signals to sub pixels which are of different display colors and in the same pixel unit according to the clock signal inputted to the second clock signal terminal CKH2 and the clock signal inputted to the fourth clock signal terminal CKV2. The second multiplexer 13 having the structure shown in FIG. 4B may transmit data signals to six data signal outputting terminals g by using one data signal inputting terminal f.

Optionally, as shown in FIG. 4A, fourth clock signal lines 162 electrically connected to the fourth clock signal terminals CKV2 of the second multiplexer 13 are configured to be multiplexed as third clock signal lines 161 electrically connected to the third clock signal terminals CKV1 of the first multiplexer 12, and second clock signal lines 142 electrically connected to the second clock signal terminals CKH2 of the second multiplexer 13 are configured to be multiplexed as first clock signal lines 141 electrically connected to the first clock signal terminals CKH1 of the first multiplexer 12. Clock signal lines corresponding to the first multiplexer 12 and clock signal lines corresponding to the second multiplexer 13 are time-division multiplexed in a pressure detection phase and a display phase. It is not necessary to additionally provide the first clock signal line CKH1 and the third clock signal line CKV1 electrically connected to the first multiplexer 12 without affecting the pressure detection and display of the display panel, and therefore the frame of the display panel is further narrowed.

Figure 5:
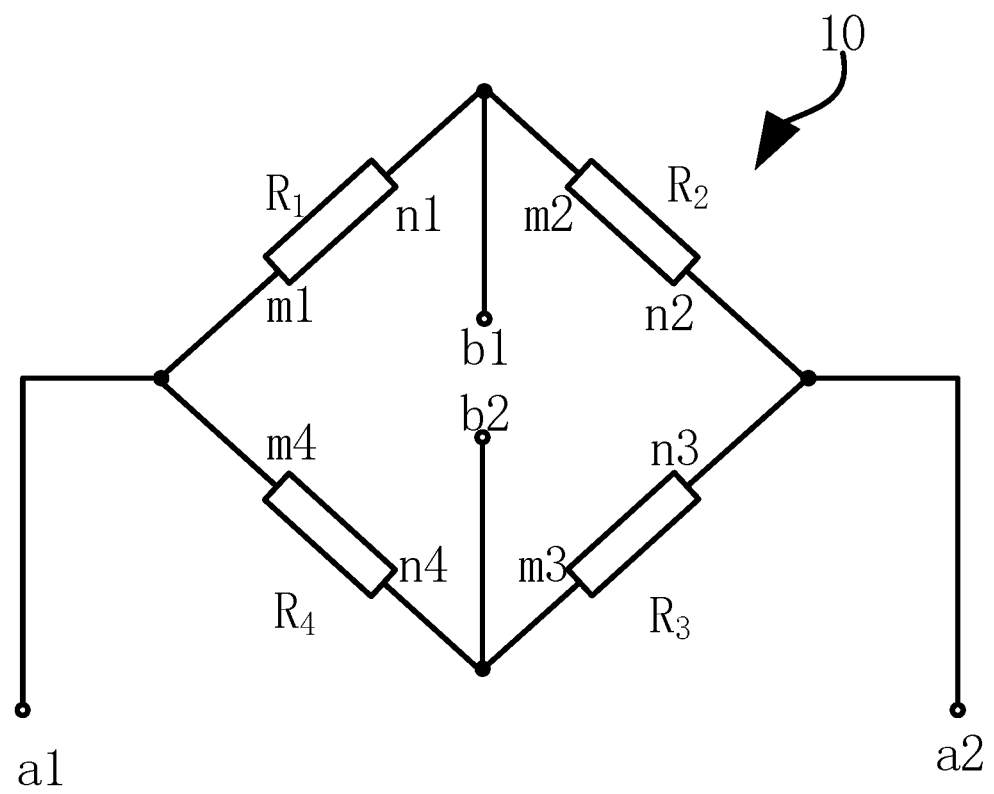
FIG. 5 is a structural schematic diagram of a pressure sensor provided by an embodiment of the present disclosure.

FIG. 5 is a structural schematic diagram of a pressure sensor provided by an embodiment of the present disclosure. As shown in FIG. 5, the pressure sensor 10 may include a first sensing resistor $R_1$, a second sensing resistor $R_2$, a third sensing resistor $R_3$ and a fourth sensing resistor $R_4$. The pressure sensor 10 further includes a first power signal inputting terminal a1, a second power signal inputting terminal a2, a first sensing signal measurement terminal b1 and a second sensing signal measurement terminal b2. A first end m1 of the first sensing resistor $R_1$ and a first end m4 of the fourth sensing resistor $R_4$ are electrically connected to the first power signal inputting terminal a1. A second end n1 of the first sensing resistor $R_1$ and a first end m2 of the second sensing resistor $R_2$ are electrically connected to first sensing signal measurement terminal b1. A second end n4 of the fourth sensing resistor $R_4$ and a first end m3 of the third sensing resistor $R_3$ are electrically connected to second sensing signal measurement terminal b2. A second end n2 of the second sensing resistor $R_2$ and a second end n3 of the third sensing resistor $R_3$ are electrically connected to the second power signal inputting terminal a2. Exemplarily, the voltage applied to the first power signal inputting terminal a1 may be a positive voltage for example, and the voltage applied to the second power signal inputting terminal a2 may be a negative voltage or a zero for example. For example, the second power signal inputting terminal a2 may be grounded.

Specifically, when there exists a certain difference between the voltage of the first power signal inputting terminal a1 and the voltage of the second power signal inputting terminal a2, each branch of a bridge circuitry composed of the four sensing resistors has a current flow there through. When the first sensing resistor $R_1$, the second sensing resistor $R_2$, the third sensing resistor $R_3$ and the fourth sensing resistor $R_4$ fail to satisfy a bridge balance condition $$\frac{R1}{R2} = \frac{R4}{R3},$$

the potential of the first power signal inputting terminal a1 is different from the potential of the second power signal inputting terminal a2. At this time, the pressure applied to the pressure sensor 10 can be detected according to the detection signal outputted by the first power signal inputting terminal a1 and the detection signal outputted by the second power signal inputting terminal a2.

Figure 6:
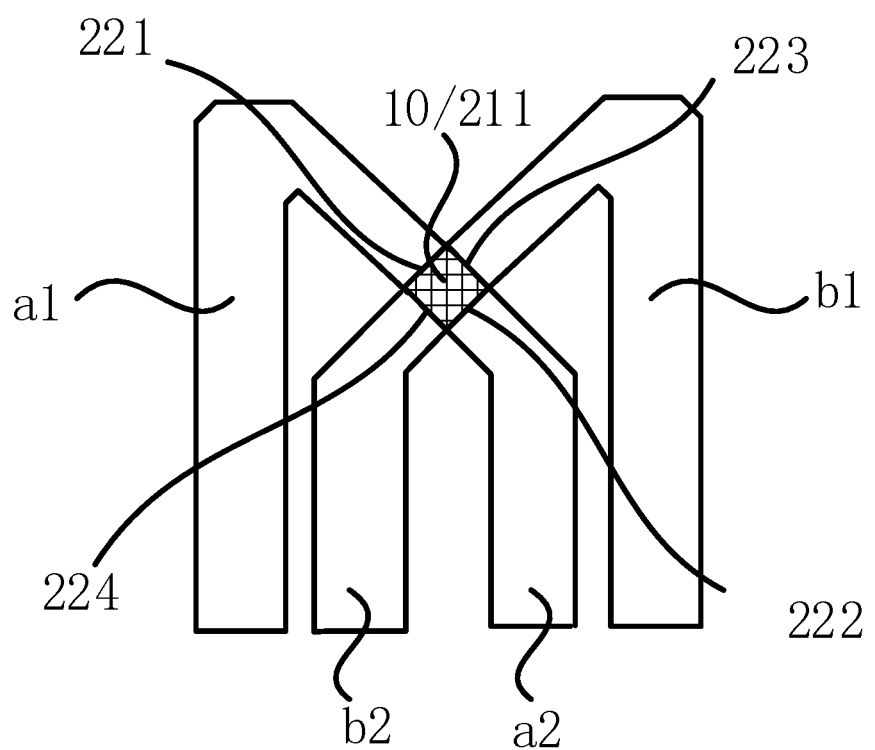
FIG. 6 is a structural schematic diagram of another pressure sensor provided by an embodiment of the present disclosure.

FIG. 6 is a structural schematic diagram of another pressure sensor provided by an embodiment of the present disclosure. As shown in FIG. 6, the pressure sensor 10 may be in a block shape and made from semiconductor materials. The shape of the pressure sensor 10 is a polygon including at least four edges. Exemplarily, the pressure sensor 10 may be a quadrangle. A first edge 221 and a second edge 222 of the pressure sensor 10 are oppositely arranged, and a third edge 223 and a fourth edge 224 of the pressure sensor 10 are oppositely arranged. The first power signal inputting terminal a1, the second power signal inputting terminal a2, the first sensing signal measurement terminal b1 and the second sensing signal measurement terminal b2 are disposed at four edges of the polygonal, respectively, and an edge where the first power signal inputting terminal a1 is located is not connected to an edge where the second power signal inputting terminal a2 is located, and an edge where the first sensing signal measurement terminal b1 is located is not connected to an edge where the second sensing signal measurement terminal b2 is located.

Specifically, the first power signal inputting terminal a1 and the second power signal inputting terminal a2 may apply a bias voltage to the pressure sensor 10 through the first edge 221 and the fourth edge 222 of the pressure sensor 10. When a pressure is applied to the touch display panel, the resistance value of a strain sensitive resistor sheet 211 of the pressure sensor 10 is changed, and strain voltages outputted from the first sensing signal measurement terminal b1 and the second sensing signal measurement terminal b2 corresponding to the pressure sensor are changed accordingly, such that the pressure applied to the pressure sensor 10 can be detected through detecting the voltage change of the strain sensitive resistor sheet 211.

It should be noted that, the type of the pressure sensor is not limited in embodiments of the present disclosure. Regardless of the types of pressure sensors to be detected, the number of detection signal terminals of the detection module can be reduced and the frame of the display panel can be narrowed through the first multiplexer and the multiplexing of the lines.

Optionally, the display panel further includes a plurality of touch detection electrodes and a plurality of touch position detection wires. Each touch position detection wire is electrically connected to a corresponding touch position detection electrode. In a pressure detection phase, at least one signal line of the pressure sensor may be configured to be multiplexed as the touch position detection wire. The touch detection electrode may be a mutual-capacitance touch detection electrode or may be a self-capacitance touch detection electrode. The touch detection electrode that is the mutual-capacitance touch detection electrode is taken as an example. Then, the touch detection electrode may include a touch driving detection electrode and a touch sensing detection electrode, and the touch position detection wire includes a touch position driving detection wire electrically connected to the touch driving detection electrode and a touch position sensing detection wire electrically connected to the touch sensing detection electrode. Exemplarily, the touch position sensing detection wire is configured to be multiplexed as a first sensing signal measurement line electrically connected to the first sensing signal measurement terminal of a respective pressure sensor or a second sensing signal measurement line electrically connected to the second sensing signal measurement terminal of a respective pressure sensor, and the touch position driving detection wire is configured to be multiplexed as a first power signal line electrically connected to the first power signal inputting terminal of a respective pressure sensor or a second power signal line electrically connected to the second power signal inputting terminal of a respective pressure sensor, thereby reducing a space of the display panel occupied by the signal lines electrically connected to the pressure sensors.

It should be noted that the accompanying drawings of embodiments of the present disclosure are only exemplary to illustrate the sizes of each component and do not represent the actual sizes of each component in the display panel.

In embodiments of the present disclosure, the display panel is provided with the first multiplexer. The first sensing signal measurement terminal of each pressure sensor is electrically connected to the first detection signal terminal of the detection module via one of the first signal inputting terminals of the first multiplexer. The second sensing signal measurement terminal of each pressure sensor is electrically connected to the second detection signal terminal of the detection module via one of the second signal inputting terminals of the first multiplexer. The first multiplexer controls, according to a clock signal inputted to the first clock signal terminal, one of the first signal inputting terminals to be connected to the first detection signal terminal and one of the second signal inputting terminal to be connected to the second detection signal terminal. In above arrangement, the pressure sensors are tested by just using two detection signal terminals, and hence the number of detection signal terminals of the detection module is greatly reduced compared with that the prior art. Further, the display panel is provided with the second multiplexer for successively outputting data signals to sub pixels which are of different display colors and in a same pixel unit, and the second clock signal line electrically connected to the second clock signal terminal of the second multiplexer is configured to be multiplexed as the first clock signal line electrically connected to the first clock signal terminal of the first multiplexer, and thus there is no need to additionally provide the first clock signal line electrically connected to the first multiplexer, thereby benefiting the realization of the narrow frame of the display panel.

Figure 7:
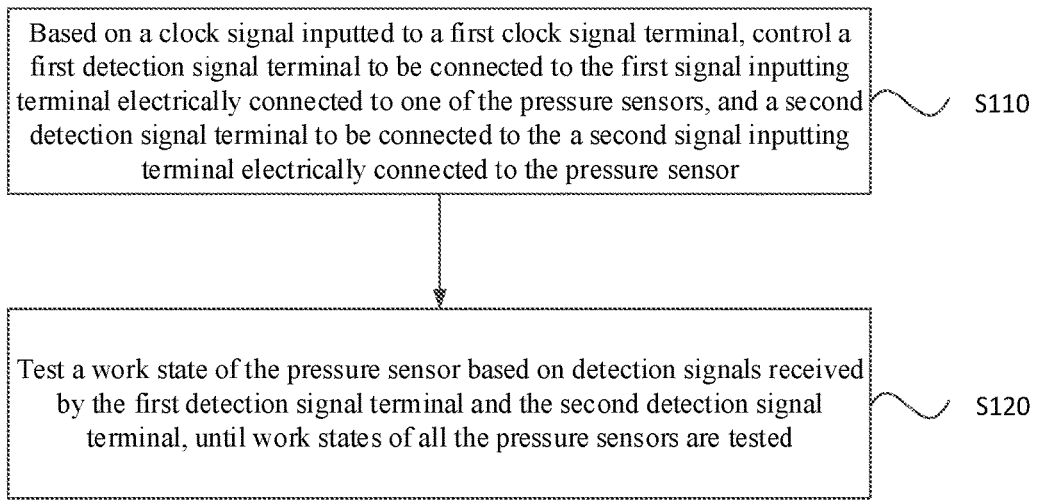
FIG. 7 is a schematic flowchart of a pressure detection method of a display panel provided by an embodiment of the present disclosure.

Embodiments of the present disclosure further provide a pressure detection method of the display panel in the above embodiments. FIG. 7 is a schematic flowchart of a pressure detection method of a display panel provided by an embodiment of the present disclosure. As shown in FIG. 7, the pressure detection method of the display panel includes step S110 and step S120.

In step S110, through clock signals inputted to first clock signal terminals, first signal inputting terminals electrically connected to pressure sensors are successively controlled to be electrically connected to the first detection signal terminal, and second signal inputting terminals electrically connected to the pressure sensors are controlled to be electrically connected to the second detection signal terminal.

Figure 8:
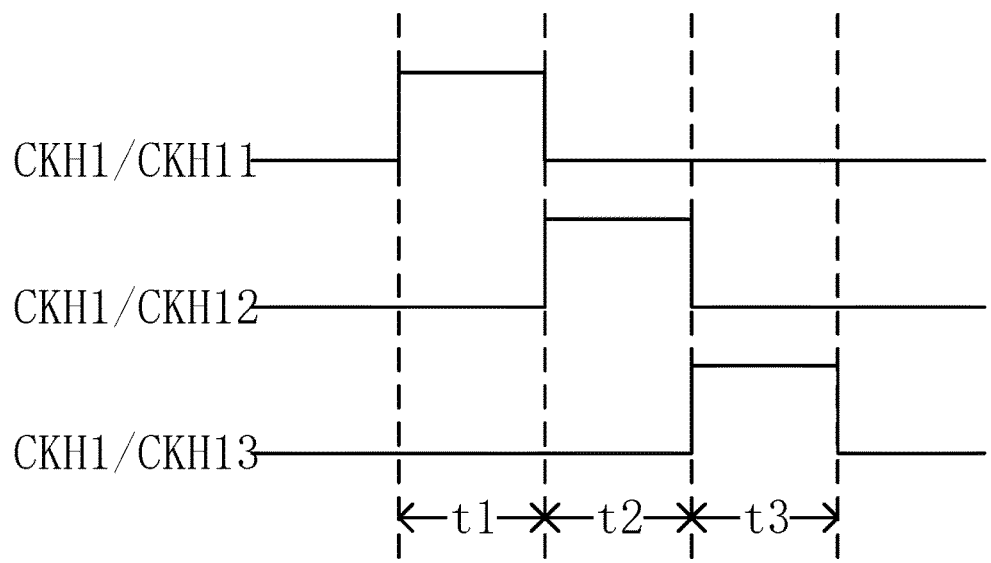
FIG. 8 is a drive timing schematic diagram of the first multiplexer provided in FIG. 2.

FIG. 8 is a drive timing schematic diagram of the first multiplexer provided in FIG. 2. Exemplarily, with reference to FIGS. 1, 2 and 8, clock signals are successively inputted to the first clock signal terminals CKH1 of the first multiplexer 12. Exemplarily, first thin film transistors T1 and second thin film transistors T2 may be arranged to be N-type thin film transistors.

In a time period t1, based on the clock signal inputted to the first clock signal terminal CKH11, the first signal inputting terminal d11 electrically connected to the first sensing signal measurement terminal b1 of the pressure sensor 101 is connected to the first signal outputting terminal e1, and the second signal inputting terminal d21 electrically connected to the second sensing signal measurement b2 of the pressure sensor 101 is electrically connected to the second signal outputting terminal e2. In the time period t1, the first detection signal terminal and the second detection signal terminal of the detection module 11 receive detection signals with respect to the pressure sensor 101.

In a time period t2, based on the clock signal inputted to the first clock signal terminal CKH12, the first signal inputting terminal d12 electrically connected to the first sensing signal measurement terminal b1 of the pressure sensor 102 is connected to the first signal outputting terminal e1, and the second signal inputting terminal d22 electrically connected to the second sensing signal measurement b2 of the pressure sensor 102 is electrically connected to the second signal outputting terminal e2. In the time period t2, the first detection signal terminal and the second detection signal terminal of the detection module 11 receive detection signals with respect to the pressure sensor 102.

In a time period t3, based on the clock signal inputted to the first clock signal terminal CKH13, the first signal inputting terminal d13 electrically connected to the first sensing signal measurement terminal b1 of the pressure sensor 103 is connected to the first signal outputting terminal e1, and the second signal inputting terminal d23 electrically connected to the second sensing signal measurement b2 of the pressure sensor 103 is electrically connected to the second signal outputting terminal e2. In the time period t3, the first detection signal terminal and the second detection signal terminal of the detection module 11 receive detection signals with respect to the pressure sensor 103.

In step S120, a work state of the pressure sensor is tested based on the detection signals received by the first detection signal terminal and the second detection signal terminal, until work states of all the pressure sensors are tested.

Specifically, the first detection signal terminal and the second detection signal terminal receive detection signals of different pressure sensors one by one, the detection module tests the corresponding pressure sensors according to the detection signals received by the first detection signal terminal and the second detection signal terminal, until work states of all the pressure sensors are tested.

Figure 9:
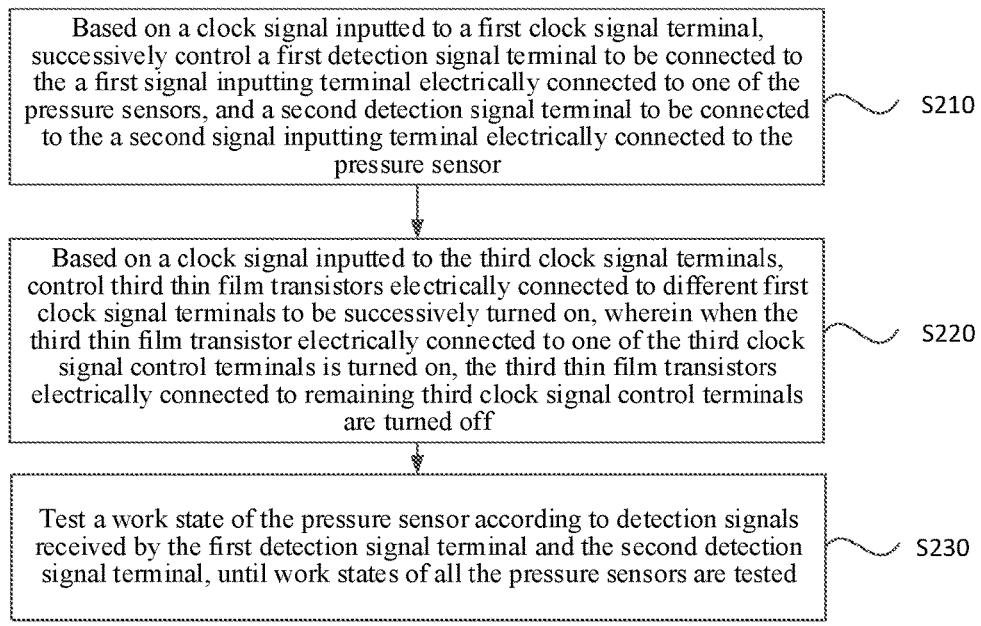
FIG. 9 is a schematic flowchart of another pressure detection method of a display panel provided by an embodiment of the present disclosure.

FIG. 9 is a schematic flowchart of another pressure detection method of a display panel provided by an embodiment of the present disclosure. As shown in FIG. 9, on the basis of the pressure detection method of the display panel shown in FIG. 7, the pressure detection method of the display panel further includes:

In step S220, third thin film transistors which are electrically connected to different first clock signal terminals are controlled to be successively turned on through clock signals inputted to the third clock signal terminals. When the third thin film transistor electrically connected to a respective one third clock signal control terminal is turned on, third thin film transistors electrically connected to remaining third clock signal control terminals are turned off.

As shown in FIG. 3, the first multiplexer 12 includes a plurality of first thin film transistors T1, a plurality of second thin film transistors T2, a plurality of third thin film transistors T3 and a plurality of third clock signal control terminals CKV1. A control terminal h1 of each first thin film transistor T1 is electrically connected to a respective first clock signal terminal CKH1, a first terminal h2 thereof is electrically connected to a respective first signal inputting terminal d1, and a second terminal h3 thereof is electrically connected to a first signal outputting terminal e1. A control terminal h1 of each second thin film transistor T2 is electrically connected to a respective first clock signal terminal CKH1, a first terminal h2 thereof is electrically connected to a respective second signal inputting terminal d2, and a second terminal h3 thereof is electrically connected to a second signal outputting terminal e2. A control terminal h1 of each third thin film transistor T3 is electrically connected to a respective third clock signal terminal CKV1, a first terminal h2 of each third thin film transistor T3 is electrically connected to a respective first clock signal terminal CKH1, and a second terminal h3 of each third thin film transistor T3 is electrically connected to the control terminal h1 of a respective first thin film transistor T1 and the control terminal h1 of a respective second thin film transistor T2.

Figure 10:
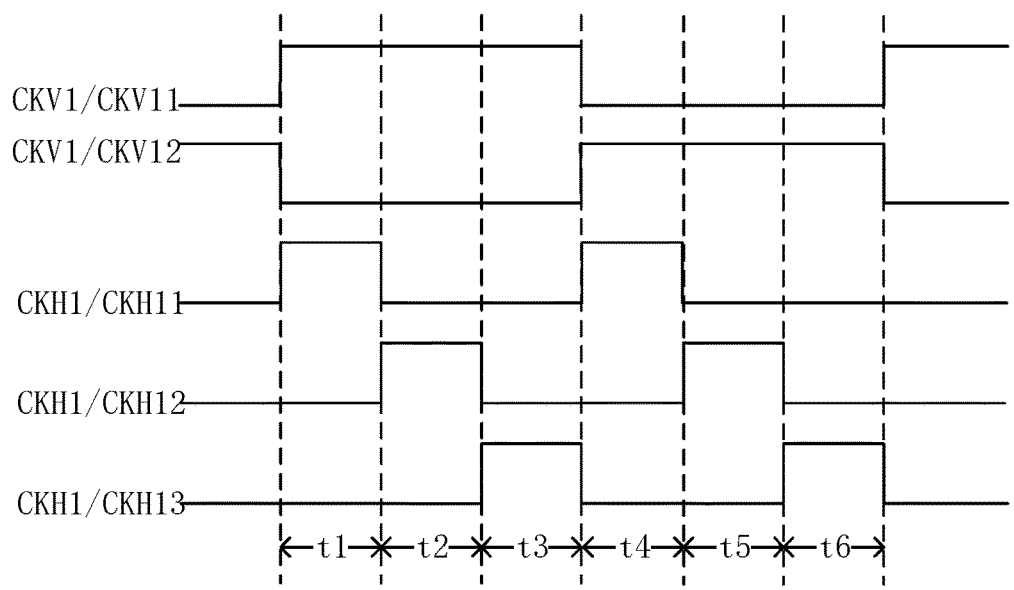
FIG. 10 is a drive timing schematic diagram of the other type of first multiplexer provided in FIG. 3.

FIG. 10 is a drive timing schematic diagram of the other type of the first multiplexer provided in FIG. 3. Exemplarily, with reference to FIGS. 1, 3 and 10, the first clock signal terminals CKH1 of the first multiplexer 12 are controlled to receive clock signals one by one, and clock signals inputted to all the first clock signal terminals CKH1 corresponding to the third clock signal terminals CKV1 are opposite to each other. Exemplarily, the first thin film transistors T1, the second thin film transistors T2 and the third thin film transistors T3 are configured to be N-type thin film transistors.

The third thin film transistors T3 electrically connected to different first clock signal terminals CKH1 are controlled to be turned on successively through clock signals inputted to the third clock signal terminals CKV1. When the third thin film transistor T3 electrically connected to a respective third clock signal control terminal CKV1 is turned on, third thin film transistors T3 electrically connected to remaining third clock signal control terminals CKV1 are turned off. That is:

In a time period t1, the first terminal h2 and the second terminal h3 of the third thin film transistor T31 are connected base on the clock signal inputted to the third clock signal terminal CKV11; the first signal inputting terminal d11 electrically connected to the first sensing signal measurement terminal b1 of the pressure sensor 101 is electrically connected to the first signal outputting terminal e1 and the second signal inputting terminal d21 electrically connected to the second sensing signal measurement terminal b2 is electrically connected to the second signal outputting terminal e2, based on the clock signal inputted to the first clock signal terminal CKH11, such that the first detection signal terminal c1 and the second detection signal terminal c2 of the detection module 11 receive detection signals with respect to the pressure sensor 101 in the time period t1.

In a time period t2, the first terminal h2 and the second terminal h3 of the third thin film transistor T32 are connected based on the clock signal inputted to the third clock signal terminal CKV11; the first signal inputting terminal d12 electrically connected to the first sensing signal measurement terminal b1 of the pressure sensor 102 is electrically connected to the first signal outputting terminal e1 and the second signal inputting terminal d22 electrically connected to the second sensing signal measurement terminal b2 is electrically connected to the second signal outputting terminal e2, based on the clock signal inputted to the first clock signal terminal CKH12, such that the first detection signal terminal c1 and the second detection signal terminal c2 of the detection module 11 receive detection signals with respect to the pressure sensor 102 in the time period t2.

In a time period t3, the first terminal h2 and the second terminal h3 of the third thin film transistor T33 are connected based on the clock signal inputted to the third clock signal terminal CKV11; the first signal inputting terminal d13 electrically connected to the first sensing signal measurement terminal b1 of the pressure sensor 103 is electrically connected to the first signal outputting terminal e1 and the second signal inputting terminal d23 electrically connected to the second sensing signal measurement terminal b2 is electrically connected to the second signal outputting terminal e2, based on the clock signal inputted to the first clock signal terminal CKH13, such that the first detection signal terminal c1 and the second detection signal terminal c2 of the detection module 11 receive detection signals with respect to the pressure sensor 103 in the time period t3.

In a time period t4, the first terminal h2 and the second terminal h3 of the third thin film transistor T34 are connected based on the clock signal inputted to the third clock signal terminal CKV12; the first signal inputting terminal d14 electrically connected to the first sensing signal measurement terminal b1 of the pressure sensor 104 is electrically connected to the first signal outputting terminal e1 and the second signal inputting terminal d24 electrically connected to the second sensing signal measurement terminal b2 is electrically connected to the second signal outputting terminal e2, based on the clock signal inputted to the first clock signal terminal CKH11, such that the first detection signal terminal c1 and the second detection signal terminal c2 of the detection module 11 receive detection signals with respect to the pressure sensor 104 in the time period t4.

In a time period t5, the first terminal h2 and the second terminal h3 of the third thin film transistor T35 are connected based on the clock signal inputted to the third clock signal terminal CKV12; the first signal inputting terminal d15 electrically connected to the first sensing signal measurement terminal b1 of the pressure sensor 105 is electrically connected to the first signal outputting terminal e1 and the second signal inputting terminal d25 electrically connected to the second sensing signal measurement terminal b2 is electrically connected to the second signal outputting terminal e2, based on the clock signal inputted to the first clock signal terminal CKH12, such that the first detection signal terminal c1 and the second detection signal terminal c2 of the detection module 11 receive detection signals with respect to the pressure sensor 105 in the time period t5.

In a time period t6, the first terminal h2 and the second terminal h3 of the third thin film transistor T36 are connected based on the clock signal inputted to the third clock signal terminal CKV12; the first signal inputting terminal d16 electrically connected to the first sensing signal measurement terminal b1 of the pressure sensor 106 is electrically connected to the first signal outputting terminal e1 and the second signal inputting terminal d26 electrically connected to the second sensing signal measurement terminal b2 is electrically connected to the second signal outputting terminal e2, based on the clock signal inputted to the first clock signal terminal CKH13, such that the first detection signal terminal c1 and the second detection signal terminal c2 of the detection module 11 receive detection signals with respect to the pressure sensor 106 in the time period t6.

Figure 11:
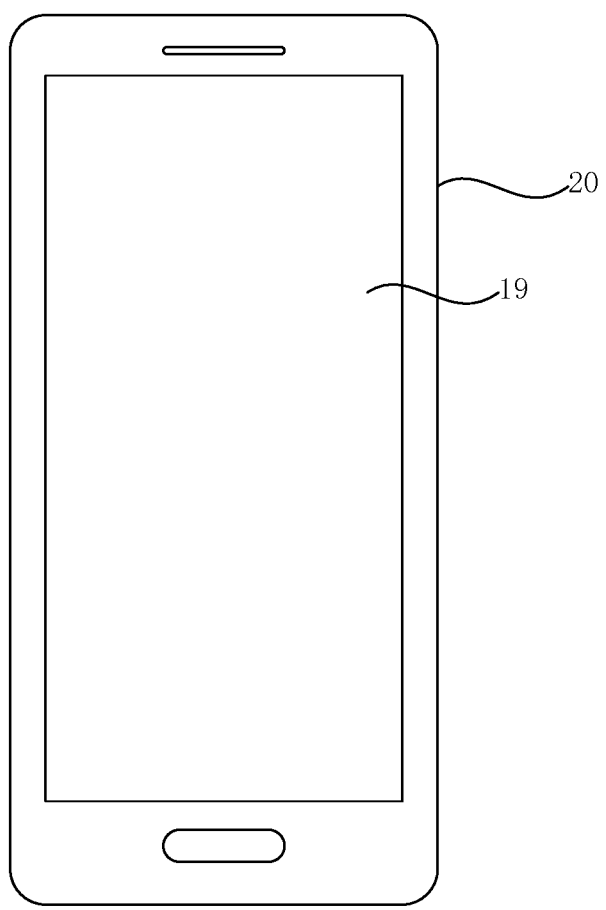
FIG. 11 is a structural schematic diagram of a display device provided by an embodiment of the present disclosure.
Figure 12A:
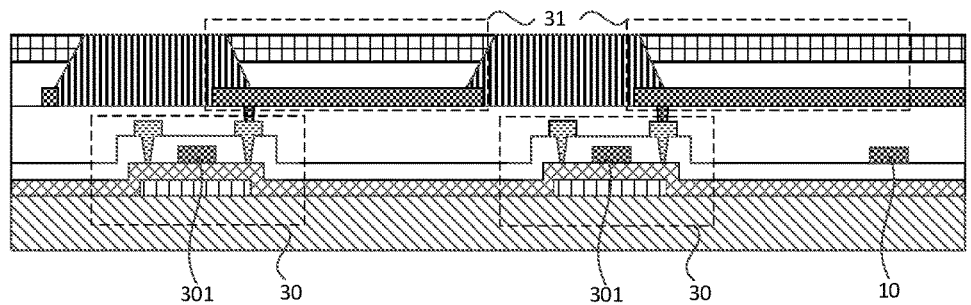
Figure 12B:
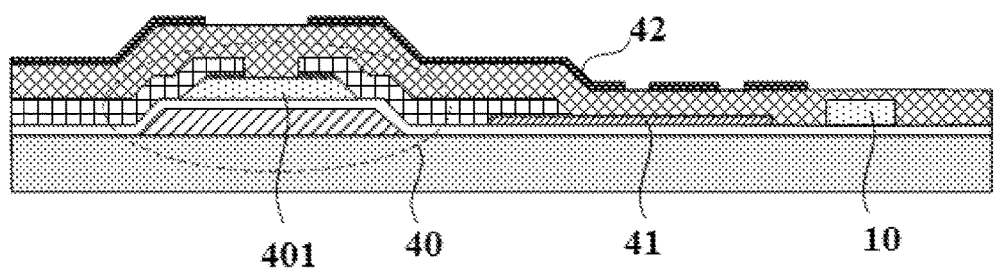
FIG. 12B is a cross sectional view of a schematic structure of a LCD display device provided by an embodiment of the present disclosure.

Embodiments of the present disclosure further provide a display panel. FIG. 11 is a structural schematic diagram of a display device provided by an embodiment of the present disclosure. As shown in FIG. 11, a display device 20 includes a display panel 19 of the above embodiments. Therefore, the display device 20 provided by embodiments of the present disclosure also has the beneficial effects described in the foregoing embodiments, and details are not described herein again. Exemplarily, as shown in FIG. 12A, the display device 20 may be an organic light-emitting display device, the display device may include a plurality of organic light-emitting structures 31 and driving transistors 30 electrically connected to the organic light-emitting structures 31 in one-to-one correspondence. Exemplarily, in order to simplify the fabrication process of the display device, the pressure sensors 10 may be fabricated at the same layer as an active layer 301 of the driving transistors 30 and be made from the same material as the active layer 301 of the driving transistors 30. Alternatively, as shown in FIG. 12B, the display device 20 may be a liquid crystal display device, and the display device may also include a plurality of driving transistors 40. Each driving transistor 40 is electrically connected to a corresponding pixel electrode 41. Liquid crystal molecules (not shown in FIG. 12B) are deflected under an electric field formed between the pixel electrode 41 and a common electrode 42, thereby achieving a display function of the liquid crystal display device. Similarly, in order to simplify the fabrication process of the display device, the pressure sensors 10 may be fabricated at the same layer as an active layer 401 of the driving transistors 40 and be made from the same material as the active layer 401 of the driving transistors 40. Exemplarily, the display device may be electronic display devices such as a mobile phone, a computer or television, etc.

It should be noted that the above contents are only preferred embodiments of the present disclosure and its technical principles. It can be understood for those skilled in the art that the present disclosure is not limited to specific embodiments described herein. For those skilled in the art, the present disclosure may be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display panel, comprising:
    a plurality of pixel units each including sub pixels for displaying colors;
    a plurality of pressure sensors, each comprising a first sensing signal measurement terminal and a second sensing signal measurement terminal;
    a detection module, comprising a first detection signal terminal and a second detection signal terminal;
    a first multiplexer, comprising a plurality of first clock signal terminals, a plurality of first signal inputting terminals, a plurality of second signal inputting terminals, a first signal outputting terminal, and a second signal outputting terminal, wherein each of the plurality of first signal inputting terminals is electrically connected to the first sensing signal measurement terminal of one of the plurality of pressure sensors, wherein each of the plurality of second signal inputting terminals is electrically connected to the second sensing signal measurement terminal of one of the plurality of pressure sensors, wherein the first signal outputting terminal is connected to the first detection signal terminal, and wherein the second signal outputting terminal is connected to the second detection signal terminal, and wherein the first multiplexer is configured to both control, according to a clock signal inputted to one of the plurality of first clock signal terminals, one of the plurality of first signal inputting terminals to be connected to the first detection signal terminal, and one of the plurality of second signal inputting terminals to be connected to the second detection signal terminal; and
    a second multiplexer, comprising a plurality of second clock signal terminals, wherein the second multiplexer is configured to successively output a data signal to the sub pixels located within a same one of the plurality of pixel units, according to a clock signal inputted to one of the plurality of second clock signal terminals;
    wherein a second clock signal line electrically connected to one of said second clock signal terminals is multiplexed as a first clock signal line electrically connected to one of said first clock signal terminals.

2. The display panel according to claim 1, wherein the first multiplexer further comprises: a plurality of first thin film transistors and a plurality of second thin film transistors, each having a control terminal, a first terminal and a second terminal;
    wherein the control terminal of each of the plurality of first thin film transistors is electrically connected to one of the plurality of first clock signal terminals, the first terminal thereof is electrically connected to one of the plurality of first signal inputting terminals, and the second terminal thereof is electrically connected to the first signal outputting terminal; and
    wherein a control terminal of each of the plurality of second thin film transistors is electrically connected to one of the plurality of first clock signal terminals, a first terminal thereof is electrically connected to one of the second signal inputting terminals, and a second terminal thereof is electrically connected to the second signal outputting terminal.

3. The display panel according to claim 2, wherein the first multiplexer further comprises: a plurality of third thin film transistors and a plurality of third clock signal terminals, each having a control terminal, a first terminal and a second terminal,
wherein the control terminal of each of the plurality of third thin film transistors is electrically connected to one of the third clock signal terminals, the first terminal thereof is electrically connected to one of the plurality of first clock signal terminals, and a second terminal thereof is electrically connected to the control terminal of one of the plurality of first thin film transistors and the control terminal of one of the plurality of second thin film transistors; and
wherein the first multiplexer is configured to control 1) one of the first signal inputting terminals to be connected to the first detection signal terminal and 2) one of the second signal inputting terminals to be connected to the second detection signal terminal, according to the clock signal inputted to one of said first clock signal terminals and the clock signal inputted to one of said third clock signal terminals.

4. The display panel according to claim 3,
wherein the second multiplexer comprises a plurality of fourth clock signal terminals, wherein the second multiplexer is configured to successively output the data signal to the sub pixels located within said same pixel unit, according to the clock signal inputted to one of said second clock signal terminals and the clock signal inputted to one of the plurality of fourth clock signal terminals; and
wherein a fourth clock signal line electrically connected to one of said fourth clock signal terminals is multiplexed as a third clock signal line electrically connected to one of said third clock signal terminals.

5. The display panel according to claim 3, wherein the first multiplexer further comprises: n first clock signal terminals, 2n first signal inputting terminals, and 2n third thin film transistors;
wherein the control terminal of one of the plurality of first thin film transistors is electrically connected to one of the n first clock signal terminals via one of the 2n third thin film transistors, respectively;
wherein the control terminal of the of the plurality of second thin film transistors is electrically connected to one of the n first clock signal terminals via one of the 2n third thin film transistors, respectively; and
wherein the control terminals of the 2n third thin film transistors electrically connected to different ones of the n first clock signal terminals are electrically connected to one of said third clock signal terminals,
wherein n is an integer greater than 1.

6. A pressure detection method of the display panel according to claim 3, comprising:
controlling successively, according to a clock signal inputted to one of the plurality of first clock signal terminals, both the first detection signal terminal to be connected to the first signal inputting terminal that is electrically connected to one of the pressure sensors, and the second detection signal terminal to be connected to the second signal inputting terminal that is electrically connected to said pressure sensor; and
testing a work state of said pressure sensor according to detection signals received by the first detection signal terminal and the second detection signal terminal, until work states of all the pressure sensors are tested.

7. The pressure detection method according to claim 6, wherein before controlling successively according to the clock signal inputted to one of the plurality of first clock signal terminals, the method further comprises:
controlling the plurality of third thin film transistors electrically connected to different ones of the plurality of first clock signal terminals to be successively turned on, according to a clock signal inputted to one of said third clock signal terminals;
wherein when a first plurality of third thin film transistors electrically connected to one of the plurality of third clock signal terminals is turned on, a second plurality of third thin film transistors electrically connected to remaining third clock signal terminals is turned off.

8. The display panel according to claim 1, wherein each of the plurality of pressure sensors further comprises a first power signal inputting terminal, a second power signal inputting terminal, a first sensing resistor, a second sensing resistor, a third sensing resistor, and a fourth sensing resistor;
wherein a first end of the first sensing resistor and a first end of the fourth sensing resistor are electrically connected to the first power signal inputting terminal;
wherein a second end of the first sensing resistor and a first end of the second sensing resistor are electrically connected to the first sensing signal measurement terminal;
wherein a second end of the fourth sensing resistor and a first end of the third sensing resistor are electrically connected to the second sensing signal measurement terminal; and
wherein a second end of the second sensing resistor and a second end of the third sensing resistor are electrically connected to the second power signal inputting terminal.

9. The display panel according to claim 1, wherein the plurality of pressure sensors each has a block shape and is made from semiconductor materials, a shape of said pressure sensor is a polygon having at least four edges, wherein said pressure sensor further comprises a first power signal inputting terminal and a second power signal inputting terminal;
wherein the first power signal inputting terminal, the second power signal inputting terminal, the first sensing signal measurement terminal, and the second sensing signal measurement terminal are disposed at the four edges of the polygon, respectively, wherein an edge where the first power signal inputting terminal is located is not connected to an edge where the second power signal inputting terminal is located, and an edge where the first sensing signal measurement terminal is located is not connected to an edge where the second sensing signal measurement terminal is located.

10. The display panel according to claim 1, further comprising: a plurality of touch detection electrodes and a plurality of touch position detection wires, wherein each of the plurality of touch position detection wires is electrically connected to a respective one of the plurality of touch detection electrodes;
wherein the plurality of pressure sensors each has signal lines;
wherein in a pressure detection phase, at least one of the signal lines of said pressure sensor is multiplexed as the touch position detection wire.

11. The display panel according to claim 1, further comprising a display region and a periphery circuit region surrounding the display region, wherein the plurality of pressure sensors are located in the periphery circuit region.

12. The display panel according to claim 1, further comprising a display region and a periphery circuit region surrounding the display region, wherein the detection module is located in the periphery circuit region.

13. A display device, comprising a display panel, wherein the display panel comprises:
- a plurality of pixel units each including sub pixels for displaying colors;
- a plurality of pressure sensors, each comprising a first sensing signal measurement terminal and a second sensing signal measurement terminal;
- a detection module, comprising a first detection signal terminal and a second detection signal terminal;
- a first multiplexer, comprising a plurality of first clock signal terminals, a plurality of first signal inputting terminals, a plurality of second signal inputting terminals, a first signal outputting terminal and a second signal outputting terminal, wherein each of the plurality of first signal inputting terminals is electrically connected to the first sensing signal measurement terminal of one of the plurality of pressure sensors, wherein each of the plurality of second signal inputting terminals is electrically connected to the second sensing signal measurement terminal of one of the plurality of pressure sensors, wherein the first signal outputting terminal is connected to the first detection signal terminal; wherein the second signal outputting terminal is connected to the second detection signal terminal, and
wherein the first multiplexer is configured to control 1) one of the plurality of first signal inputting terminals to be connected to the first detection signal terminal and 2) one of the plurality of second signal inputting terminals to be connected to the second detection signal terminal, according to a clock signal inputted to the plurality of first clock signal terminals; and
a second multiplexer, comprising a plurality of second clock signal terminals, wherein the second multiplexer is configured to successively output a data signal to sub pixels located within a same one of the plurality of pixel units, according to a clock signal inputted to one of the plurality of second clock signal terminals;
wherein a second clock signal line electrically connected to one of the plurality of second clock signal terminals is multiplexed as a first clock signal line electrically connected to one of said first clock signal terminals.

* * * * *